(12) United States Patent
Kuo (10) Patent No.: US 9,972,561 B2
(45) Date of Patent: May 15, 2018

(54) QFN PACKAGE WITH GROOVED LEADS (71) Applicant: Suzhou ASEN Semiconductors Co., Ltd., Suzhou (CN)

(72) Inventor: Kwei-Kuan Kuo, Suzhou (CN)

(73) Assignee: SUZHOU ASEN SEMICONDUCTORS CO., LTD., Suzhou (CN)

( * ) Notice: Subject to any disclaimer, the term of this patent is extended or adjusted under 35 U.S.C. 154(b) by 0 days. days.

(21) Appl. No.: 14/586,872

(22) Filed: Dec. 30, 2014

(65) Prior Publication Data
US 2015/0187683 A1 Jul. 2, 2015

(30) Foreign Application Priority Data

Dec. 31, 2013 (CN) .......................... 2013 1 0752935

(51) Int. Cl.
*H01L 23/495* (2006.01)
*H01L 23/48* (2006.01)
(Continued)

(52) U.S. Cl.
CPC .. *H01L 23/49541* (2013.01); *H01L 23/49548* (2013.01); *H01L 23/49582* (2013.01);
(Continued)

(58) Field of Classification Search
CPC ........ H01L 23/49541; H01L 23/49582; H01L 23/49548; H01L 2224/48247;
(Continued)

(56) References Cited

U.S. PATENT DOCUMENTS 6,400,004 B1 * 6/2002 Fan ..................... H01L 23/3107
257/666
6,608,366 B1 * 8/2003 Fogelson ............. H01L 21/561
257/666

(Continued)

FOREIGN PATENT DOCUMENTS

CN 101452903 A 6/2009
CN 101694837 A 4/2010
(Continued)

OTHER PUBLICATIONS

Office Action with Search Report from related Chinese Patent Application No. 201310752935.0, dated Oct. 30, 2014, 7 pages.

*Primary Examiner* — Duy T Nguyen
*Assistant Examiner* — Dilinh Nguyen
(74) *Attorney, Agent, or Firm* — Foley & Lardner LLP; Cliff Z. Liu (57) ABSTRACT

The present invention relates to a semiconductor package and a method for forming a semiconductor package. A lead frame adapted to a semiconductor package includes a first carrier, an adjacent second carrier, a first array of leads, and a second array of leads. The first array and the second array of leads are configured to be connected to circuits located at the first and second carriers at respective near sides of the arrays. The first array of leads and the second array of leads are connected through connecting ribs, and a groove is provided on exposed surfaces. After the connecting rib is removed, a part of the groove still remains. The remaining part of the groove is exposed in a separate die package, and in a surface-mount procedure, molten solder achieves wetting more easily along the groove to make surface mounting more secure.

7 Claims, 6 Drawing Sheets (51) Int. Cl.
  *H01L 23/04* (2006.01)
  *H01L 21/48* (2006.01)
(52) U.S. Cl.
  CPC ..... *H01L 21/4821* (2013.01); *H01L 2224/48091* (2013.01); *H01L 2224/48247* (2013.01); *H01L 2224/97* (2013.01)

(58) Field of Classification Search
  CPC ........... H01L 21/4821; H01L 23/49503; H01L 23/49506; H01L 23/4951; H01L 23/49513; H01L 33/62; H01L 2225/06548; H01L 2225/1047; H01L 23/043; H01L 23/3128; H01L 2225/1064; H01L 23/04; H01L 2224/42; H01L 24/42
  USPC .................. 257/676, 692, 693, 730, 784
  See application file for complete search history.

(56) References Cited

U.S. PATENT DOCUMENTS

| 8,329,509 | B2 | 12/2012 | Gong et al. |
| 2001/0019856 | A1* | 9/2001 | Takahashi ......... H01L 23/49562 438/127 |
| 2008/0012100 | A1 | 1/2008 | Punzalan et al. |
| 2010/0133693 | A1 | 6/2010 | Arshad |
| 2011/0244629 | A1 | 10/2011 | Gong et al. |
| 2012/0306065 | A1* | 12/2012 | Bin Mohd Arshad ............. H01L 23/49548 257/676 |
| 2015/0076675 | A1* | 3/2015 | Real .............. H01L 23/49548 257/676 |

FOREIGN PATENT DOCUMENTS

| CN | 102184908 A | 9/2011 |
| CN | 203721713 U | 7/2014 |

* cited by examiner

QFN PACKAGE WITH GROOVED LEADS

CROSS-REFERENCE TO RELATED APPLICATION

This application claims the benefit of PRC (China) Patent Application No. 201310752935.0, filed 31 Dec. 2013, the disclosure of which is incorporated herein by reference in its entirety.

BACKGROUND OF THE INVENTION

1. Field of the Invention

The present invention generally relates to chip packaging, and more particularly, to a package of a Quad Flat No-lead (QFN) structure.

2. Description of the Related Art

QFN is a no-lead package in a square shape or a rectangular shape. A solder pad having a large exposed area is provided at the central position of the bottom of the package to provide a heat transfer effect, and an electrically conductive solder pad for implementing electrical connection is provided at the periphery of the package having a large solder pad. Because gull-wing-form leads as in conventional SOIC and TSOP packages are not provided in a QFN package, the conductive path between internal leads and the solder pad is short, and both a coefficient of self-induction and wiring resistance inside a package are low. Therefore, it provides excellent electrical performance. In addition, it further provides desirable heat dissipation performance by means of an exposed lead frame solder pad, and the solder pad provides a passage for direct heat dissipation, so as to release heat inside the package. Usually, a solder pad for heat dissipation is directly soldered on a circuit board, and heat dissipation vias in a PCB help dissipation of excessive power consumption to a copper ground plate to absorb excessive heat.

SUMMARY OF THE INVENTION

One main objective of the present invention is to provide a new lead frame solution to further improve performance.

An embodiment discloses a lead frame adapted to a semiconductor package, the lead frame including a first carrier and an adjacent second carrier, a first array of leads, and a second array of leads. The first array of leads is located at a side, facing the second carrier, of the first carrier, and configured to be connected to a circuit located on the first carrier. The second array of leads is located at a side, facing the first carrier, of the second carrier, and configured to be connected to a circuit located on the second carrier. The first array of leads and the second array of leads are connected through connecting ribs, and a groove is provided on exposed surfaces of the first array of leads and the second array of leads. A part of the groove still remains after the connecting rib is removed. The remaining part of the groove has a depth within a range from $1/3$ to $2/3$ of a thickness of the lead, and an opening at an end portion of the lead with a width ranging from $1/4$ to $2/3$ of a width of the lead. The remaining part of the groove extends within a range from $1/6$ to $1/2$ in a length direction from the end portion of the lead.

In an embodiment, the lead frame further includes thinned protrusions located at end portions of the first array of leads and the second array of leads.

In another embodiment, a bridging portion, which is between leads, of the connecting rib in the lead frame is thinned.

In a further embodiment, the groove on the arrays of leads of the lead frame is sealable by an adhesive film.

In yet another embodiment, the maximum width, which is in a width direction of the lead, of the remaining part of the groove on the arrays of leads of the lead frame is greater than the width of the opening of the remaining part of the groove at the end portion of the lead.

An embodiment discloses a semiconductor package, which includes: a carrier; an array of leads located around the carrier; a die fixed on the carrier and electrically connected to the array of leads through metal wires; and an encapsulant covering the die and the metal wires, and at least partially covering the carrier and the array of leads; wherein at least one lead in the array of leads is provided with a groove having an opening at an outer edge, the depth of the groove is within a range from $1/3$ to $2/3$ of the thickness of the lead, the width of the opening is within a range from $1/4$ to $2/3$ of the width of the lead, and the groove extends within a range from $1/6$ to $1/2$ in a length direction of the lead.

In an embodiment, the maximum width, which is in a width direction of the lead, of the groove on the lead of the semiconductor package is greater than the width of the opening of the groove at the outer edge of the lead.

An embodiment discloses a method for forming a semiconductor package, the method including: forming a lead frame including: a first carrier and an adjacent second carrier; a first array of leads, located at a side, facing the second carrier, of the first carrier, and configured to be connected to a circuit located on the first carrier; and a second array of leads, located at a side, facing the first carrier, of the second carrier, and configured to be connected to a circuit located on the second carrier; wherein the first array of leads and the second array of leads are connected through connecting ribs. The method further includes: forming a groove on the exposed surfaces of at least one pair of leads of the first array of leads and the second array of leads, wherein a part of the groove still remains after the connecting rib is removed, the remaining part of the groove has a depth within a range from $1/3$ to $2/3$ of a thickness of the lead and an opening at an end portion of the lead with a width ranging from $1/4$ to $2/3$ of a width of the lead, and the remaining part the groove extends within a range from $1/6$ to $1/2$ in a length direction from the end portion of the lead.

In an embodiment, the method for forming a semiconductor package further includes the steps of: coating an exposed surface of the lead frame; performing molding; and performing singulation by removing the connecting ribs to form a semiconductor package.

In another embodiment, the groove is sealed for isolation from outside during the coating step in the method for forming a semiconductor package, so as to avoid pollution during the molding process.

In yet another embodiment, the method for forming a semiconductor package further includes: thinning the connecting rib at a bridging portion between leads.

An embodiment discloses a semiconductor package, including: a carrier; an array of leads located around the carrier; a die, fixed on the carrier, and electrically connected to the array of leads through metal wires; and an encapsulant, covering the die and the metal wires, and at least partially covering the carrier and the array of leads; where a groove having an opening at an outer edge is provided on at least one lead in the array of leads.

In an embodiment, an embedded, thinned wing-form protrusion is provided on at least one lead in the array of leads of the semiconductor package.

In an embodiment, the depth of the groove on the lead of the semiconductor package is within a range from ⅓ to ⅔ of the thickness of the lead.

In an embodiment, the width of the opening of the groove on the lead of the semiconductor package is within a range from ¼ to ⅔ of the width of the lead.

In an embodiment, the groove on the lead of the semiconductor package extends within a range from ⅙ to ½ in a length direction of the lead.

In an embodiment, the maximum width, which is in a width direction of the lead, of the groove on the lead of the semiconductor package is greater than the width of the opening at the outer edge of the lead.

In an embodiment, the maximum width, which is in a width direction of the lead, of the groove on the lead of the semiconductor package is less than the length of the groove extending in a length direction of the lead.

An embodiment discloses a semiconductor package, including: a carrier; an array of leads, located around the carrier; a die, fixed on the carrier, and electrically connected to the array of leads through metal wires; and an encapsulant, covering the die and the metal wires, and at least partially covering the carrier and the array of leads; where a groove having an opening at an outer edge is provided on at least one lead in the array of leads, and the groove includes a well portion and an extending portion between the well portion and the opening.

In an embodiment, the well portion of the groove of the semiconductor package is circular or elliptic.

In an embodiment, an embedded, thinned wing-form protrusion is provided on at least one lead in the array of leads of the semiconductor package.

In an embodiment, the depth of the groove on the lead of the semiconductor package is within a range from ⅓ to ⅔ of the thickness of the lead.

In an embodiment, the width of the opening of the groove on the lead of the semiconductor package is within a range from ¼ to ⅔ of the width of the lead.

In an embodiment, the maximum width of the well portion on the lead of the semiconductor package is within a range from 3/10 to ¾ of the width of the lead.

In an embodiment, the groove on the lead of the semiconductor package extends within a range from ⅙ to ½ in a length direction of the lead.

An embodiment discloses a method for forming a semiconductor package, including: forming a lead frame including: a first carrier and an adjacent second carrier; a first array of leads, located at a side, facing the second carrier, of the first carrier, and configured to be connected to a circuit located on the first carrier; and a second array of leads, located at a side, facing the first carrier, of the second carrier, and configured to be connected to a circuit located on the second carrier; wherein the first array of leads and the second array of leads are connected through connecting ribs; and a groove is formed on the exposed surfaces of at least one pair of leads of the first array of leads and the second array of leads, and a part of the groove still remains after the connecting rib is removed.

In an embodiment, the method for forming a semiconductor package further includes the steps of: coating the exposed surface of the lead frame; performing molding; and performing singulation by removing the connecting ribs to form a semiconductor package.

In an embodiment, the groove is sealed during the coating step in the method for forming a semiconductor package.

In an embodiment, the method for forming a semiconductor package further includes: thinning the connecting rib at a bridging portion between leads.

In an embodiment, the depth of the remaining part of the groove formed in the method for forming a semiconductor package is within a range from ⅓ to ⅔ of the thickness of the lead.

In an embodiment, the remaining part of the groove formed in the method for forming a semiconductor package has an opening at an end portion of the lead, and the width of the opening is within a range from ¼ to ⅔ of the width of the lead.

In an embodiment, the remaining part of the groove formed in the method for forming a semiconductor package extends within a range from ⅙ to ½ in a length direction from the end portion of the lead.

BRIEF DESCRIPTION OF THE DRAWINGS

The detailed description below about preferred embodiments of the present invention will become more comprehensible with reference to the accompanying drawings. The present invention is described by using examples, and is not limited to the accompanying drawings. Similar reference numerals in the accompanying drawings indicate similar elements.

PREFERRED EMBODIMENT OF THE PRESENT INVENTION

The detailed description of the accompanying drawings is intended to serve as description of currently preferred embodiments of the present invention rather than to represent the only forms in which the present invention can be implemented. It should be understood that same or equivalent functions may be accomplished by different embodiments that are intended to fall within the spirit and scope of the present invention.

Figure 1:
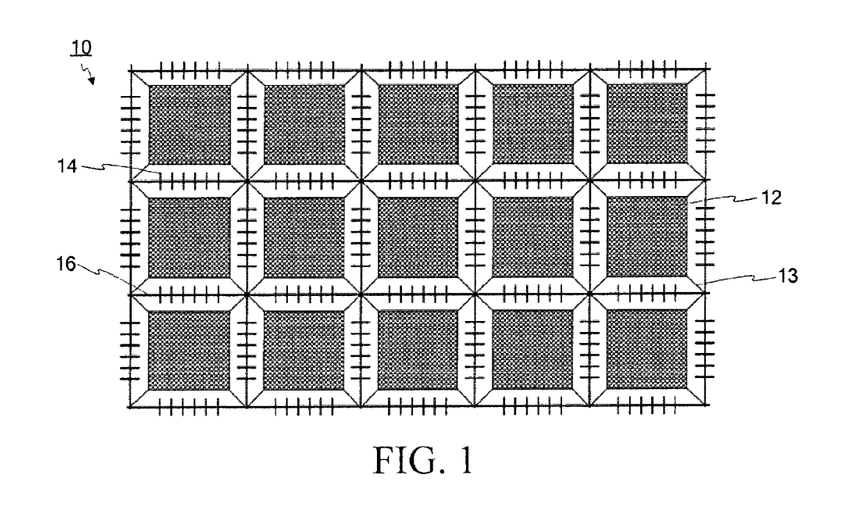
FIG. 1 shows an embodiment of a planar layout of a lead frame adapted to a QFN package.

As shown in FIG. 1, a lead frame 10 adapted to a QFN package includes an array of carriers 12. Arrays of leads 14 between adjacent carriers 12 are connected through a connecting rib 16. The connecting ribs 16 are connected to each other to form a net-like structure, so that the lead frame is connected into a whole. The carrier 12 is connected to the frame through supporting rods 13. It should be understood that the accompanying drawings including FIG. 1 are intended to schematically show relative position relationships among the carriers 12, the arrays of leads 14, the connecting ribs 16, and other members, rather than to precisely show the sizes and proportions of members. The lead frame 10 is adapted to integral packaging with other members, and the connecting ribs 16 are removed after packaging to form each independent chip in a QFN package.

Figure 2A:
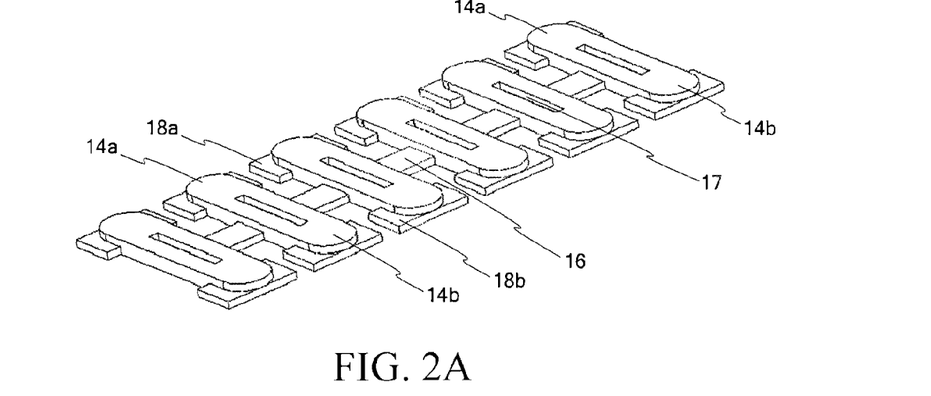
FIG. 2A is a partial perspective view of an embodiment of a lead frame adapted to a QFN package.

FIG. 2A is a perspective view of a partial structure between two adjacent carriers in a lead frame. As shown in FIG. 2A, an array of leads 14a and an array of leads 14b are connected through connecting ribs 16. Two adjacent carriers that are not shown in FIG. 2A are located at a near side of the array of leads 14a and a near side of the array of leads 14b, respectively. The array of leads 14a and the array of leads 14b are respectively configured to be connected to circuits (the circuit usually refers to a die used for packaging; however, other members having an electrical function such as some passive elements may also be included) located at the carriers at respective near sides of the arrays. A bridging portion, which is between adjacent leads, of the connecting rib 16 is thinned. A thinned protrusion 18a is provided at an end portion of the lead 14a, and a thinned protrusion 18b is provided at an end portion of the lead 14b. The protrusions help fixation of the lead in a package. Each lead 14a is aligned with and connected to one lead 14b, and a groove 17 spanning two sides of the connecting rib is provided on exposed surfaces of the leads 14a and 14b. The thinned portion of the connecting rib 16, the protrusion 18 at the end portion of the lead, and the groove 17 may be formed through stamping during fabrication of the lead frame, or may also be formed through partially etching after the frame is formed; or a part of them are formed through stamping, and another part of them are formed through partially etching.

Figure 2B:
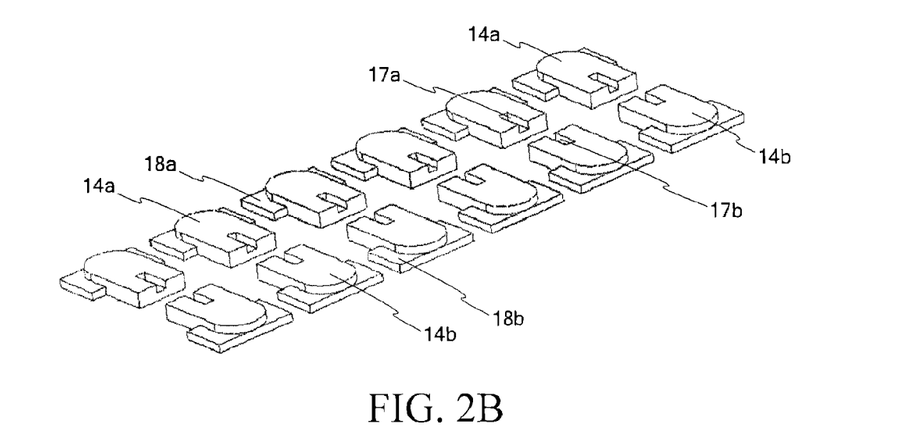
FIG. 2B is a perspective view of the part in FIG. 2A after connecting ribs are removed.

FIG. 2B is a perspective view of the part in FIG. 2A after connecting ribs are removed. After the connecting ribs 16 are removed, the array of leads 14a is disconnected from the array of leads 14b, and a part 17a of the groove 17 remains on the lead 14a, and a part 17b of the groove 17 remains on the lead 14b. The partially thinned connecting rib 16 reduces metal debris in the process of removal, thereby reducing the risk that metal debris fills the remaining grooves 17a, 17b (that is, a remaining part of the groove 17 after the connecting rib 16 is removed after packaging is completed, so that the remaining grooves 17a, 17b are the remaining parts of the groove 17, and it is the same hereinafter). Each of the remaining grooves 17a and 17b is exposed in a separate die package, and in a surface-mount procedure, molten solder achieves wetting more easily along the groove to make surface mounting more secure. Although both the leads 14a, 14b shown in FIG. 2A and FIG. 2B have grooves, it can be readily understood that in some other embodiments, no groove is present in some leads of a lead frame or a QFN package.

Figure 3:
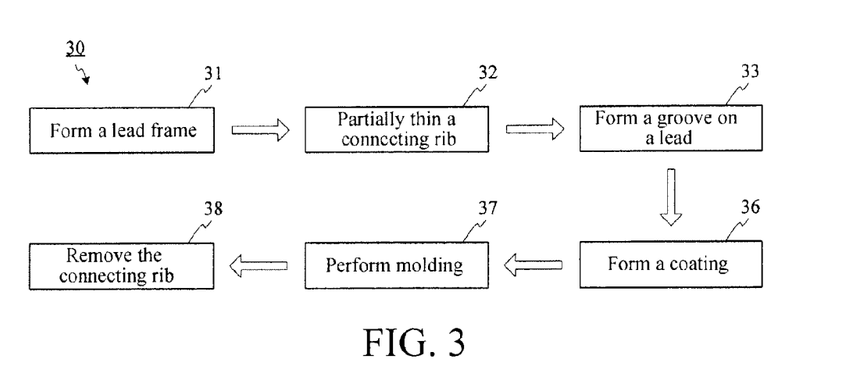
FIG. 3 is a method flow chart of an embodiment of forming a QFN package.

FIG. 3 is a flow chart of a method 30 for forming a QFN package. The method 30 includes Steps 31, 32, 33, 36, 37, and 38. In Step 31, a lead frame, for example, but not limited to the lead frame in the layout shown in FIG. 1, is formed, where arrays of leads between adjacent carriers are connected through a connecting rib, and the connecting ribs are connected to each other to form a net-like structure, so that the lead frame is connected into a whole. In Step 32, the connecting ribs in the lead frame are partially thinned. In Step 33, grooves are formed on exposed surfaces of the arrays of leads, and the groove still partially remains after the connecting rib is removed. The arrays of leads and the connecting ribs formed in Steps 32 and 33 are, for example, but not limited to what is shown in FIG. 2A, and the thinning depth of the connecting rib and the depth of the groove may be different. In Step 36, a protective adhesive film is bonded to an exposed surface of the lead frame, that is, the surface where the grooves are formed on the arrays of leads. Next, in Step 37, integral molding is performed. When the procedure of integral molding is performed, because an encapsulant is integrally filled and sealed on the front surface of the entire lead frame, and it is very difficult to tightly bond the rear surface (that is, the surface where the grooves are opened on the arrays of leads) of the lead frame to a mold, so that the encapsulant may pollute the rear surface of the lead frame through gaps. For example, the encapsulant is filled in the grooves 17 in the arrays of leads shown in FIG. 2A, and a product is polluted and becomes a rejected product. The protective adhesive film may be desirably bonded to the lead frame, and therefore the encapsulant may be prevented from passing through gaps to pollute the rear surface of the lead frame in the process of the procedure of integral molding. In addition, because the protective adhesive film is preferably bonded on the lead frame right after the grooves are formed on the arrays of leads, the protective adhesive film may achieve both the effects of protecting the leads on the rear surface of the lead frame and preventing oxidation. The thinned portion of the partially thinned connecting rib is surrounded by packaging encapsulant, so that metal means including the arrays of leads and the connecting ribs are combined in the packaging encapsulant in a more compact manner. Next, in Step 38, cutting is performed according to cutting paths among chip modules, and the cutting paths have the same width as the connecting ribs or are slightly wider than the connecting ribs, so as to remove the connecting ribs to form each separate QFN package; this step may also be referred to as a singulation step.

In another embodiment, Steps 32 and 33 may be combined to be completed in one step, and may be completed one time regardless of a stamping method or an etching method.

Figure 4:
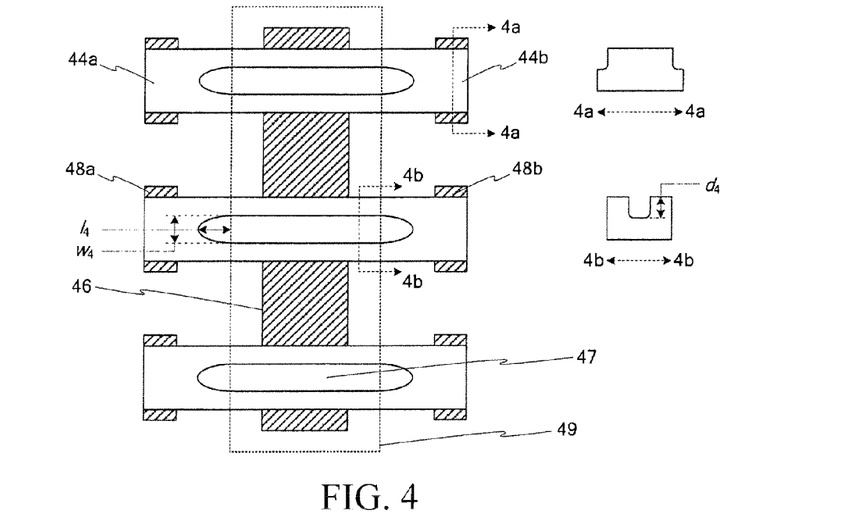
FIG. 4 is a partial planar layout of an embodiment of a lead frame adapted to a QFN package.

FIG. 4 shows a partial planar layout of a structure between two adjacent carriers in a lead frame. An array of leads 44a and an array of leads 44b between the two adjacent carriers are aligned, and are connected through a connecting rib 46. The array of leads 44a and the array of leads 44b are respectively arranged to be connected to circuits located at carriers at respective near ends of the arrays. A bridging portion, which is between adjacent leads, of the connecting rib 46 is thinned. A thinned protrusion 48a is provided at an end portion of the lead 44a, and a thinned protrusion 48b is provided at an end portion of the lead 44b. The protrusion helps fixation of the lead in a package. A groove 47 spanning two sides of the connecting rib is provided on exposed surfaces of the leads. A dotted-line box 49 shows a cutting line, that is, a part to be removed in a singulation step. After the connecting rib 46 is removed, a part of the groove 47 still remains respectively on the leads 44a and 44b. Sections that correspond respectively to a sectional line 4a at the protrusion and a sectional line 4b at the groove 47 are shown on the right side in FIG. 4. The leads 44a and 44b are symmetric and are all basically consistent in length, width, and thickness. The depth d4 of the remaining groove is within a range from ⅓ to ⅔ of the thickness of the lead 44a, 44b. An opening of the remaining groove is usually located right in the middle of the lead, and the width w4 of the opening is within a range from ¼ to ⅔ of the width of the lead. The length 14 extends within a range from ⅙ to ½ in a length direction of the lead. Such a remaining groove in an aspect ensures a sufficient volume to avoid filling with debris, in an aspect provides an inclined angle less steep than a right angle to facilitate wetting and soldering of molten solder, and in an aspect further ensures sufficient structural strength of leads.

Figure 5:
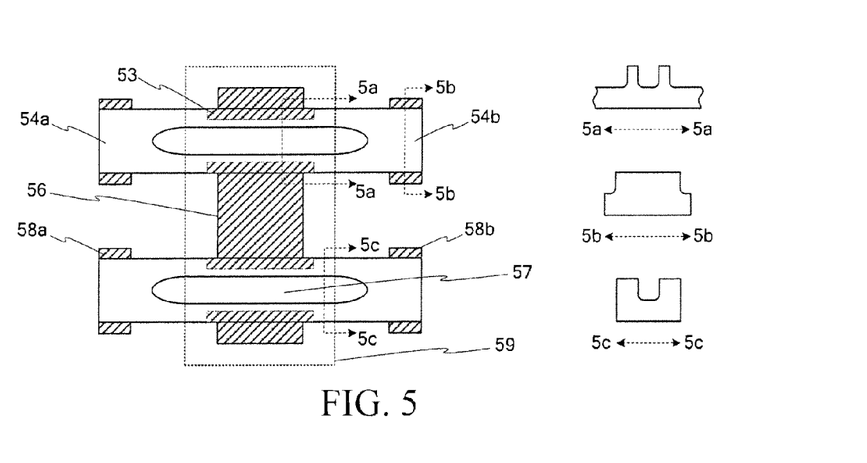
FIG. 5 is a partial planar layout of another embodiment of a lead frame adapted to a QFN package.

FIG. 5 shows a partial planar layout of a structure between two adjacent carriers in another lead frame. An array of leads 54a and an array of leads 54b between the two adjacent carriers are aligned, and are connected through a connecting rib 56. The array of leads 54a and the array of leads 54b are respectively arranged to be connected to circuits located at carriers at respective near ends of the arrays. A bridging portion, which is between adjacent leads, of the connecting rib 56 is thinned. A thinned protrusion 58a is provided at an end portion of the lead 54a, and a thinned protrusion 58b is provided at an end portion of the lead 54b. The protrusion helps fixation of the lead in a package. A groove 57 spanning two sides of the connecting rib is provided on exposed surfaces of the leads. A dotted-line box 59 shows a cutting line, that is, a part to be removed in a singulation step. After the connecting rib 56 is removed, a part of the groove 57 still remains respectively on the leads 54a and 54b. The thinned portion of the connecting rib extends from the bridging portion on to the lead to form a groove 53, and the groove 53 and the groove 57 are isolated from each other, and the length of the groove 53 is less than and is within the width of the region of the cutting line 59. The thinned portion of the partially thinned connecting rib 56 is surrounded by packaging encapsulant, and the groove 53 is filled with packaging encapsulant, so that metal means including the arrays of leads and the connecting ribs are combined in packaging encapsulant in a more compact manner. Sections that correspond respectively to a sectional line 5a at the regions of the grooves 53 and 57, a sectional line 5b at the region of the protrusion, and a sectional line 5c at the region of the groove 57 are shown on the right side in FIG. 5. The leads 54a and 54b are symmetric and are all basically consistent in length, width, and thickness. The depth of the remaining groove is within a range from ⅓ to ⅔ of the thickness of the lead 54a, 54b. An opening of the remaining groove is usually located right in the middle of the lead, and the width of the opening is within a range from ¼ to ⅔ of the width of the lead. The remaining groove extends within a range from ⅙ to ½ in a length direction of the lead. Such a remaining groove in an aspect ensures a sufficient volume to avoid filling with debris, in an aspect provides an inclined angle less steep than a right angle to facilitate wetting and soldering of molten solder, and in an aspect further ensures sufficient structural strength of leads. The thinned groove 53 extending from the bridging portion further reduces a total amount of metal debris, thereby preventing the remaining part of the groove 57 from being filled.

Figure 6:
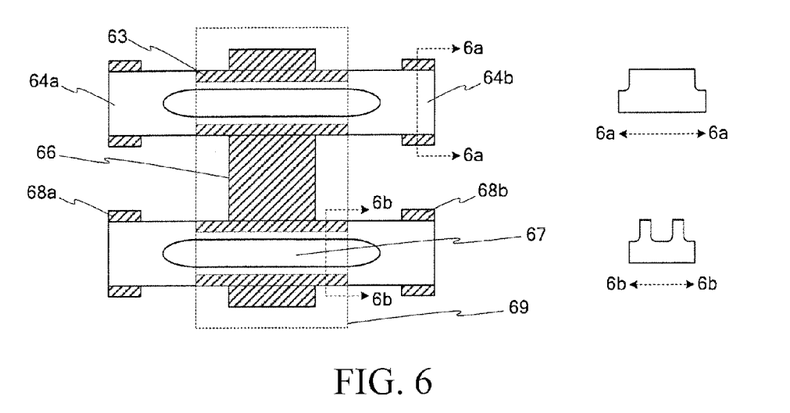
FIG. 6 is a partial planar layout of yet another embodiment of a lead frame adapted to a QFN package.

FIG. 6 shows a partial planar layout of a structure between two adjacent carriers in yet another lead frame. An array of leads 64a and an array of leads 64b between the two adjacent carriers are aligned, and are connected through a connecting rib 66. The array of leads 64a and the array of leads 64b are respectively arranged to be connected to circuits located at carriers at respective near ends of the arrays. A bridging portion, which is between adjacent leads, of the connecting rib 66 is thinned. A thinned protrusion 68a is provided at an end portion of the lead 64a, and a thinned protrusion 68b is provided at an end portion of the lead 64b. The protrusion helps fixation of the lead in a package. A groove 67 spanning two sides of the connecting rib is provided on exposed surfaces of the leads. A dotted-line box 69 shows a cutting line, that is, a part to be removed in a singulation step. After the connecting rib 66 is removed, a part of the groove 67 still remains respectively on the leads 64a and 64b. The thinned portion of the connecting rib extends from the bridging portion on to the lead to form a groove 63, the groove 63 and the groove 67 are isolated from each other, and the length of the groove 63 is equal to and is located right within the width of the region of the cutting line 69. Sections that correspond respectively to a sectional line 6a at the region of the protrusion and a sectional line 6b at the regions of the grooves 63 and 67 are shown on the right side in FIG. 6. The leads 64a and 64b are symmetric, and are all basically consistent in length, width, and thickness. The depth of the remaining groove is within a range from ⅓ to ⅔ of the thickness of the lead 64a, 64b. An opening of the remaining groove is usually located right in the middle of the lead, and the width of the opening is within a range from ¼ to ⅔ of the width of the lead. The remaining groove extends within a range from ⅙ to ½ in a length direction of the lead. Such a remaining groove in an aspect ensures a sufficient volume to avoid filling with debris, in an aspect provides an inclined angle less steep than a right angle to facilitate wetting and soldering of molten solder, and in an aspect further ensures sufficient structural strength of leads. The thinned groove 63 extending from the bridging portion further reduces a total amount of metal debris, thereby preventing the remaining part of the groove 67 from being filled.

Figure 7:
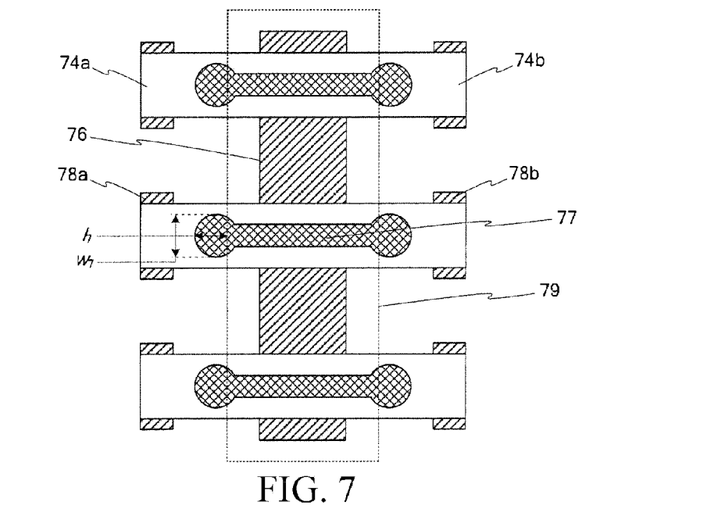
FIG. 7 is a partial planar layout of a further embodiment of a lead frame adapted to a QFN package.

FIG. 7 shows a partial planar layout of a structure between two adjacent carriers in a further lead frame. An array of leads 74a and an array of leads 74b between the two adjacent carriers are aligned, and are connected through a connecting rib 76. The array of leads 74a and the array of leads 74b are respectively arranged to be connected to circuits located at carriers at respective near ends of the arrays. A bridging portion, which is between adjacent leads, of the connecting rib 76 is thinned. A thinned protrusion 78a is provided at an end portion of the lead 74a, and a thinned protrusion 78b is provided at an end portion of the lead 74b. The protrusion helps fixation of the lead in a package. A groove 77 spanning two sides of the connecting rib is provided on exposed surfaces of the leads. The overall shape of the groove 77 is a shape having a small size in the middle but a large size at two ends, and in FIG. 7, a dumbbell shape is used as an example, in which two end portions are circular. A dotted-line box 79 shows a cutting line, that is, a part to be removed in a singulation step. After the connecting rib 76 is removed, a part of the groove 77 stills remains respectively on the leads 74a and 74b, and the maximum width of the remaining groove in a width direction of the lead is greater than the width of the opening, which is at the end portion of the lead, of the remaining groove, and as shown in FIG. 7, the groove 77 is a larger half circle on the remaining lead. The leads 74a and 74b are symmetric, and are all basically consistent in length, width, and thickness. The depth of the remaining groove is within a range from ⅓ to ⅔ of the thickness of the lead 74a, 74b. An opening of the remaining groove is usually located right in the middle of the lead, and the maximum size w7 of the remaining groove is within a range from 3/10 to ¾ of the width of lead. The length 17 of the remaining groove extends within a range from ⅙ to ½ in a length direction of the lead. Such a remaining groove has more desirable effects, and in addition to the advantages in the embodiments described above, during wetting and soldering of molten solder, because of the structural design in this embodiment, the remaining groove has a relatively large lateral surface area on the remaining lead, a relatively large area for wetting and soldering is provided. In addition, the remaining groove in this embodiment has a seal of a relatively small size at the end portion of the lead, and may form a pointed structure at the groove of the lead. During board soldering in the package, when both the bottom surface and the lateral surface of the remaining lead of the package are wet by and soldered with a soldering material (naturally the remaining groove is filled with the soldering material), in this case, a structure that seals solder is formed at an end portion of the remaining lead, that is, the end portion of the remaining lead is enveloped by a solder at both the remaining groove and the lateral surface of the remaining lead, and a structure in which the end portion of the remaining lead is inserted in the solder is provided. In such a solder sealing structure, for a QFN package, a solder on a board and the package are combined in a more secure manner, so that a great improvement is made in terms of reliability.

Figure 8:
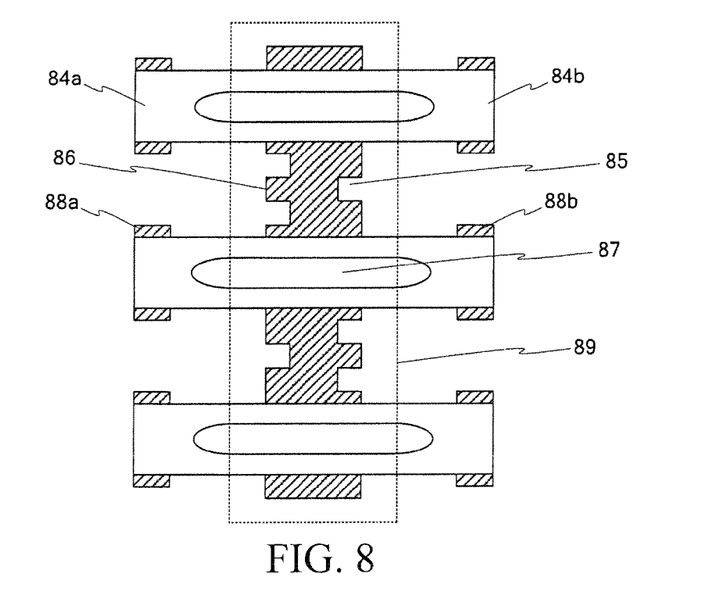
FIG. 8 is a partial planar layout of yet another embodiment of a lead frame adapted to a QFN package.

FIG. 8 shows a partial planar layout of a structure between two adjacent carriers in a further lead frame. An array of leads 84a and an array of leads 84b between two adjacent carriers are aligned, and are connected through a connecting rib 86. The array of leads 84a and the array of leads 84b are respectively arranged to be connected to circuits located at carriers at respective near ends of the arrays. A bridging portion, which is between adjacent leads, of the connecting rib 86 is thinned, and several notches 85 are provided at the portion. A thinned protrusion 88a is provided at an end portion of the lead 84a, and a thinned protrusion 88b is provided at an end portion of the lead 84b. The protrusion helps fixation of the lead in a package. A groove 87 spanning two sides of the connecting rib is provided on exposed surfaces of the leads. A dotted-line box 89 shows a cutting line, that is, a part to be removed in a singulation step. After the connecting rib 86 is removed, a part of the groove 87 still remains respectively on the leads 84a and 84b. The leads 84a and 84b are symmetric, and are all basically consistent in length, width, and thickness. The depth of the remaining groove is within a range from ⅓ to ⅔ of the thickness of the lead 84a, 84b. An opening of the remaining groove is usually located right in the middle of the lead, and the width of the opening is within a range from ¼ to ⅔ of the width of the lead. The remaining groove extends within a range from ⅙ to ½ in a length direction of the lead. Such a remaining groove in an aspect ensures a sufficient volume to avoid filling with debris, in an aspect provides an inclined angle less steep than a right angle to facilitate wetting and soldering of molten solder, and in an aspect further ensures sufficient structural strength of leads. The design of the notch 85 in an aspect does not affect the structural strength of the connecting rib 86, and in another aspect further reduces debris generated in a singulation step, thereby preventing the remaining part of the groove 87 from being filled.

Figure 9:
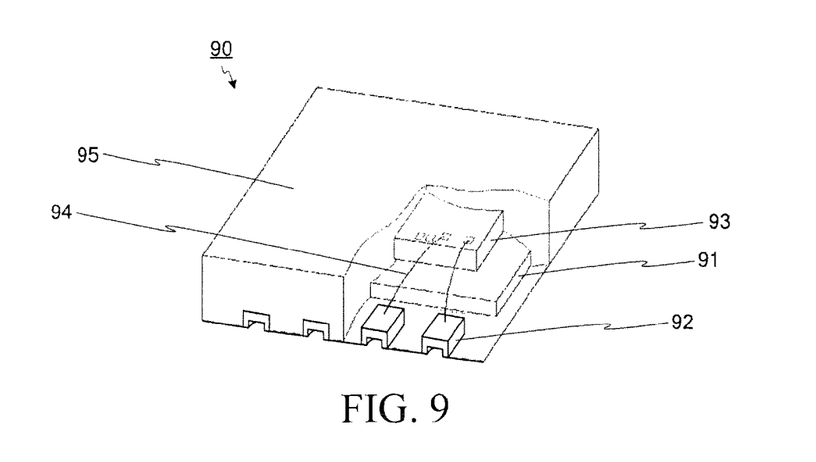
FIG. 9 is a partial sectional view of a QFN package.

FIG. 9 shows a partial sectional view of a QFN package 90. The package 90 includes: a carrier 91, an array of leads 92, a die 93, a metal wire 94, and an encapsulant 95. The array of leads 92 is located around the carrier 91. The die 93 is fixed on the carrier 91 and is electrically connected to the array of leads through the metal wire 94. The encapsulant 95 covers the die 93 and the metal wire 94, and partially covers the carrier 91 and the array of leads 92. The bottom surface of the carrier 91 is exposed to facilitate heat dissipation of the die. The bottom surface and outer side surface of the lead 92 are exposed for being connected by using a solder. A groove having an opening at an outer edge is provided on the lead 92, and the groove is similar with the remaining grooves 17a, 17b in FIG. 2B. The depth of the groove is within a range from ⅓ to ⅔ of the thickness of the lead, the width of the opening is within a range from ¼ to ⅔ of the width of the lead, and the groove extends within a range from ⅙ to ½ in a length direction of the lead. Such a groove in an aspect ensures a sufficient volume to avoid filling with debris generated in a singulation process, in an aspect provides an inclined angle less steep than a right angle to facilitate wetting and soldering of molten solder, and in an aspect further ensures sufficient structural strength of leads.

In an embodiment, the maximum width, which is in a width direction of a lead, of a groove on the lead of a QFN package is greater than the width of an opening at an outer edge of the lead. The advantages of such a design have been described in the embodiment in FIG. 7, and are no longer elaborated herein.

Figure 10A:
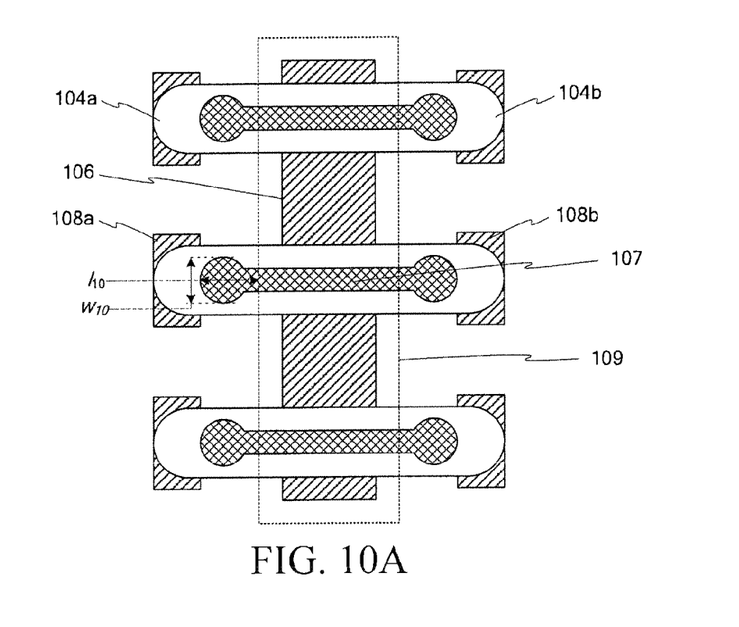
FIG. 10A is a partial planar layout of yet another embodiment of a lead frame adapted to a QFN package.
Figure 10B:
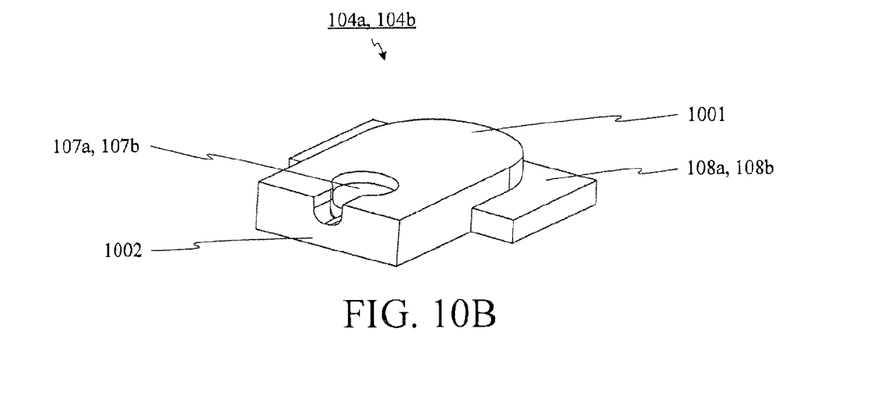
FIG. 10B is a schematic perspective view of the remaining part of a groove shown in FIG. 10A.

FIG. 10A shows a partial planar layout of a structure between two adjacent carriers in yet another lead frame. An array of leads 104a and an array of leads 104b between two adjacent carriers are aligned, and are connected through a connecting rib 106. The array of leads 104a and the array of leads 104b are respectively arranged to be connected to circuits located at carriers at respective near ends of the arrays. A bridging portion, which is between adjacent leads, of the connecting rib 106 is thinned. A thinned protrusion 108a is provided at an end portion of the lead 104a, and a thinned protrusion 108b is provided at an end portion of the lead 104b. The protrusion helps fixation of the lead in a package. A groove 107 spanning two sides of the connecting rib is provided on exposed surfaces of the leads. The overall shape of the groove 107 is a shape having a small size in the middle but a large size at two ends. The groove 107 shown in FIG. 10A has a dumbbell shape, in which two end portions are circular. A dotted-line box 109 shows a cutting line, that is, a part to be removed in a singulation step. After the connecting rib 106 is removed, a part of the groove 107 still remains respectively on the leads 104a and 104b. The remaining part on the remaining lead of the groove 107 shown in FIG. 10A includes a well portion and an extending portion that extends from the well portion to an edge of the lead, the maximum width of the well portion is greater than the width of the opening, which is at the end portion of the lead, of the remaining groove or the width of the extending portion. The shape of the well portion is, for example, but is not limited to, a circular shape or elliptic shape. The leads 104a and 104b are symmetric, and are all basically consistent in length, width, and thickness. The depth of the remaining groove is within a range from ⅓ to ⅔ of the thickness of the lead 104a, 104b. An opening of the remaining groove is usually located right in the middle of the lead, and the width of the opening is within a range from ¼ to ⅔ of the width of the lead, the maximum width w10 of the remaining groove is within a range from ³⁄₁₀ to ¾ of the width of the lead. The length of 110 of the remaining groove extends within a range from ⅙ to ½ in a length direction of the lead, and 110 is greater than w10. FIG. 10B is a schematic perspective view of the remaining groove part 107a, 107b shown in FIG. 10A. The surfaces 1001 and 1002 where the groove is located are exposed at the surface of the package, while other surfaces and a wing-form protrusion 108a, 108b are embedded in the package. Such a remaining groove has more desirable effects, and in addition to the advantages in the embodiments described above, during wetting and soldering of molten solder, because of the structural design in this embodiment, the remaining groove has a relatively large lateral surface area on the remaining lead, a relatively large area for wetting and soldering is provided. In addition, the remaining groove in this embodiment has a seal of a relatively small size at the end portion of the lead, and may form a pointed structure at the groove of the lead. During board soldering in the package, when both the bottom surface and the lateral surface of the remaining lead of the package are wet by and soldered with a soldering material (naturally the remaining groove is filled with the soldering material), in this case, a structure that seals solder is formed at an end portion of the remaining lead, that is, the end portion of the remaining lead is enveloped by a solder at both the remaining groove and the lateral surface of the remaining lead, and a structure in which the end portion of the remaining lead is inserted in the solder is provided. In such a solder sealing structure, for a QFN package, a solder on a board and the package are combined in a more secure manner, so that a great improvement is made in terms of reliability.

Although different embodiments of the present invention have been illustrated and described, the present invention is not limited to these embodiments. It does not mean that technical features that only appear in some claims or embodiments cannot be combined with other features in other claims or embodiments to implement new beneficial technical solutions. Many modifications, changes, variations, replacements, and equivalents are apparent to persons skilled in the art without departing from the spirit and scope of the present invention as described in the claims.

What is claimed is:

1. A semiconductor package, comprising:
   a carrier;
   an array of leads, located around the carrier;
   a die, fixed on the carrier, and electrically connected to the array of leads through metal wires; and
   an encapsulant, covering the die and the metal wires, and at least partially covering the carrier and the array of leads;
   wherein at least one lead in the array of leads is provided with a groove having an opening at an outer edge of a first end portion of the lead, and wherein the at least one lead in the array of leads is provided with a thinned protrusion at a second end portion of the lead opposite the first end portion, the thinned protrusion extends from the lead in a width direction of the lead, the thinned protrusion is embedded in the encapsulant such that the encapsulant covers a top surface, a bottom surface and a side surface of the thinned protrusion, and the side surface of the thinned protrusion is opposite to a side surface of the lead that is exposed from the encapsulant.

2. The semiconductor package according to claim 1, wherein a width of the groove varies along a length of the groove.

3. The semiconductor package according to claim 1, wherein a depth of the groove is within a range from $1/3$ to $2/3$ of a thickness of the lead.

4. The semiconductor package according to claim 1, wherein a width of the opening of the groove is within a range from $1/4$ to $2/3$ of a width of the lead.

5. The semiconductor package according to claim 1, wherein the groove extends within a range from $1/6$ to $1/2$ in a length direction of the lead.

6. The semiconductor package according to claim 1, wherein the groove is a first groove, and wherein the at least one lead in the array of leads is provided with a second groove along a length of the lead and isolated from the first groove.

7. The semiconductor package according to claim 1, wherein a thickness of the thinned protrusion is less than a thickness of the lead.

* * * * *